US010200078B2

(12) United States Patent
Ellä et al.

(10) Patent No.: US 10,200,078 B2
(45) Date of Patent: Feb. 5, 2019

(54) MULTIPLEXER AND MOBILE COMMUNICATION DEVICE COMPRISING A MULTIPLEXER

(71) Applicant: SnapTrack, Inc., San Diego, CA (US)

(72) Inventors: Juha Ellä, Halikko (FI); Pasi Lehtonen, Rusko (FI); Pekka Ikonen, Espoo (FI)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 15/308,569

(22) PCT Filed: May 19, 2014

(86) PCT No.: PCT/EP2014/060250
§ 371 (c)(1),
(2) Date: Nov. 2, 2016

(87) PCT Pub. No.: WO2015/176739
PCT Pub. Date: Nov. 26, 2015

(65) Prior Publication Data
US 2017/0077986 A1    Mar. 16, 2017

(51) Int. Cl.
*H04B 1/52* (2015.01)
*H04B 1/04* (2006.01)
*H04B 7/04* (2017.01)
*H04B 7/0413* (2017.01)

(52) U.S. Cl.
CPC ............ *H04B 1/52* (2013.01); *H04B 1/0458* (2013.01); *H04B 7/0413* (2013.01); *H04B 2001/0408* (2013.01)

(58) Field of Classification Search
CPC .................................................. H04B 7/0413
See application file for complete search history.

(56) References Cited

U.S. PATENT DOCUMENTS

| | | | |
|---|---|---|---|
| 8,933,764 B2* | 1/2015 | Khlat | H03H 7/09 333/126 |
| 9,240,622 B2* | 1/2016 | Schmidhammer | H01P 1/213 |
| 9,391,587 B2* | 7/2016 | Schmidhammer | H03H 9/0566 |
| 2008/0129640 A1* | 6/2008 | Shtrom | H01Q 3/24 343/876 |
| 2012/0264459 A1* | 10/2012 | Johansson | H04W 24/00 455/457 |

(Continued)

FOREIGN PATENT DOCUMENTS

| | | |
|---|---|---|
| DE | 102010046677 A1 | 3/2012 |
| JP | 2002111556 A | 4/2002 |

(Continued)

OTHER PUBLICATIONS

International Search Report corresponding to PCT Application No. PCT/EP2014/060250, European Patent Office, dated Jan. 29, 2015; (3 pages).

*Primary Examiner* — Rasheed Gidado
(74) *Attorney, Agent, or Firm* — Patterson & Sheridan, L.L.P.

(57) ABSTRACT

A multiplexer with excellent electrical properties and a low number of electrical components is provided that may be used in a communication device with two TX paths and two RX paths. The multiplexer comprises three hybrids and two duplexers. Further, a mobile communication device comprising such a multiplexer is provided.

11 Claims, 5 Drawing Sheets

(56) References Cited

U.S. PATENT DOCUMENTS

2013/0234806 A1    9/2013  Schmidhammer et al.
2014/0049337 A1*   2/2014  Schmidhammer ...... H03F 1/022
                                                    333/117

FOREIGN PATENT DOCUMENTS

JP    2006254112 A    9/2006
JP    2008-177956 A   7/2008
JP    2012209720 A   10/2012

* cited by examiner

MULTIPLEXER AND MOBILE COMMUNICATION DEVICE COMPRISING A MULTIPLEXER

CROSS-REFERENCE TO RELATED APPLICATIONS

This application is a U.S. National Stage of International Application No. PCT/EP2014/060250, filed May 19, 2014, which is incorporated herein by reference in its entirety.

The present invention refers to multiplexers and to mobile communication devices comprising such multiplexers. A multiplexer provides several signal paths and compact spatial dimensions.

BACKGROUND

Modern mobile communication devices shall provide the functionality of transmitting and receiving RF (Radio Frequency) signals virtually at the same time. Duplexer circuits are used to separate TX (transmit) signals from RX (receive) signals and provide a high isolation of the respective signal paths. Further, it is preferred that duplexers provide a highly linear behavior, robustness against antenna mismatch, a high integration density—i.e. small spatial dimensions—and a small number of electric components.

However, the current trend towards devices providing more different frequency bands and transmission modes is contrary to small spatial dimensions and—due to mutual interaction—to good electrical properties.

From patent application US 2013/0234806, duplexer circuits that provide superior isolation properties are known. But for the high isolation, a complex network of conventional duplexers and hybrid circuits is needed.

Further, WCDMA (Wideband Code Division Multiple Access)-standard already supports RX diversity functionality. According to the LTE standard, RX MIMO (Multiple Input Multiple Output) functionality is mandatory.

Thus, mobile communication devices need further circuits such as filters, amplifiers and/or switches to comply with these standards. However, as stated above, integration of such further circuitry is problematic.

What is needed is a circuitry that can be used in mobile communication devices, that complies with the standards and is compatible with further signal paths without jeopardizing already simultaneously achieved geometric compactness and good electrical properties.

Accordingly, it is an object of the present invention to provide such circuitry and improve mobile communication devices.

Such circuitry (namely a multiplexer) and such devices are provided by the independent claims. Dependent claims define preferred embodiments.

DESCRIPTION OF THE INVENTION

A multiplexer supports signal transmission in a main signal path and in a second signal path. The multiplexer comprises a TX-side hybrid with a main TX port, an RX-side hybrid with a main RX port, an antenna-side hybrid with a main antenna port and with a second antenna port. Further, the multiplexer comprises a first duplexer and a second duplexer. The first duplexer connects the TX-side hybrid to the antenna-side hybrid. Further, the first duplexer connects the RX-side hybrid to the antenna-side hybrid. The second duplexer connects the TX-side hybrid to the antenna-side hybrid and connects the RX-side hybrid to the antenna-side hybrid.

Thus, in this multiplexer, each of the two duplexers is electrically connected with each of its three ports to one of the three hybrids each. The two duplexers are mainly electrically connected in parallel. A phase shift of signals propagating through a port of one duplexer and a port of the other duplexer is, however, possible. Especially, it is possible that there is a phase shift between any of the ports of the two duplexers connected to a given hybrid selected from the three hybrids.

The duplexers can be conventional duplexers comprising a transmission filter and a reception filter and a common antenna port. It is also possible that each of the duplexers or both duplexers are tunable. Especially, each filter—e.g. for Tx signals and Rx signals respectively—of each duplexer can be tunable. Then, the common antenna port of each duplexer is connected to one respective port of the antenna-side hybrid. Each transmission port of each duplexer is connected to a respective port of the TX-side hybrid. Each reception port of each duplexer is electrically connected to a respective port of the RX-side hybrid.

Each hybrid can be a conventional hybrid comprising four ports. Each of the four ports can act as a signal input port while two of the three remaining ports act as corresponding output ports and have a phase difference of e.g. 90°, with respect to each other. Further, it is possible that for each port of the hybrid being an input port, one port is not directly affected by the respective RF-signals.

The antenna-side hybrid has, thus, two antenna ports via which signal transmission in the main signal path and in the second signal path is simultaneously possible without detrimental interaction. The main TX port of the TX-side hybrid can be used as a TX port of the main signal path and the RX port of the RX-side hybrid can be used as a RX port of a transmission in the main signal path. As the TX-side hybrid and the RX-side hybrid have a further port each, at least one of the further ports can be used as a transmission port or as a reception port for the second signal path. The above-described interconnection of duplexers and hybrids provides a simultaneously possible signal transfer in the main signal path and in the second signal path, respectively.

Compared to conventional multiplexers comprising two or more duplexers that may be cascaded, superior electrical properties such as a superior isolation between transmission ports and reception ports are obtained.

Compared to duplexers known from US2013/0234806, no further circuit element such as filters or switches are needed but a completely new second signal path that may be utilized for transmission signals and reception signals simultaneously is provided.

However, the superior isolation properties of US2013/0234806 with respect to each combination of TX signals and RX signals cannot be maintained.

It is, thus, possible that the TX port is provided for TX signals of the main signal path while the RX port is provided for RX signals of the main signal path.

For this main signal path comprising the TX-side hybrid and its main TX port, the RX-side hybrid with its main RX port and the antenna-side hybrid with its main antenna port, the described connection of duplexers and hybrids provides superior isolation properties because TX signals from the main TX port unwanted at the main RX port are conducted via the hybrids and via the duplexers only as low-power signals over-coming the respective duplexer's isolation at the main RX port. Due to the phase changing nature of the hybrids, respective unwanted signals arrive via the two parallel duplexer paths at the RX port with a phase shift of 180°. Thus, the already very weak signals are mainly destructively cancelled out.

As long as the hybrids are balanced well and constructed symmetrically, these destructive interference effects are mainly independent from signals propagating in the second signal path.

It is further possible that not more than one external port of the multiplexer is terminated to ground.

Each hybrid has four ports. Two ports of these four ports are used for connection to the respective duplexer. Each duplexer has three ports but each of those three ports is connected to one hybrid. Thus, each hybrid has only two further ports that can be contacted arbitrarily to an external circuit environment. Accordingly, these six ports establish the external ports of the multiplexer.

The duplexer circuits of US2013/0234806 has also six ports left. But three of those six ports are needed to be terminated to ground to provide a path for unwanted signals to be conducted to ground.

Thus, one major difference between the present multiplexer and the duplexer circuits of US2013/0234806 is the termination status of external ports.

It is possible that one of the external ports terminated to ground is terminated via a 50Ω impedance element. However, further impedance values such as 25Ω, 100Ω or 200Ω are also possible. The impedance element can be a resistance element.

It is possible that the TX-side hybrid has a second TX port.

This second TX port may be the TX port of the second signal path. While the main TX port may be utilized for transmission signals propagating from the main TX port to a main antenna connected at the main antenna port, the second antenna port may be utilized for transmission signals to the second antenna port.

It is further possible that the RX-side hybrid has a second RX port. Accordingly, the second RX port can be the RX port of the second signal path and can be used to receive signals received via a second antenna connected at the second antenna port.

It is further possible that the multiplexer has only one port being selected from the second TX port and the second RX port while the respective other port is terminated to ground.

However, the multiplexer can have both: the second TX port and the second RX port to provide signal duplexing in the main signal path and in the second signal path. Then, the multiplexer is a quadplexer.

Is it possible that the main antenna port is connected to a main antenna of a mobile communication device while the second antenna port is connected to a diversity antenna or to a MIMO antenna of the mobile communication device.

It is possible that the multiplexer further comprises a power amplifier and/or a low noise amplifier in the second signal path. Of course, the multiplexer can have a power amplifier and/or a low noise amplifier in the first signal path, too. One great advantage of the present topology of hybrids and duplexers is that the main signal path and the second signal path share signal conducting segments in which power amplifiers or low noise amplifiers can be arranged. Thus, one and the same power amplifier and/or low noise amplifier can be utilized for the main signal path and for the second signal path and, thus, for a main transmission system and for a second transmission system simultaneously. Then, not only the need for further filters but also the need for further amplifiers has been overcome despite the provided diversity and/or MIMO functionality.

It is further possible that both duplexers are used in the main signal path for TX and RX signals of the main transmission system and in the second signal path for TX and/or RX signals in the second transmission system as already described above.

Further, it is possible that the multiplexer is part of a mobile communication device and replaces a plurality of duplexers or duplexer circuits and establishes an important section of a front-end module. Accordingly, a mobile communication device is provided which comprises one of the above-described multiplexers.

It is further possible that the mobile communication device comprises one or several main antenna and one or several second antennas to which the corresponding antenna ports of the antenna-side hybrid is connected.

Further, it is possible that the mobile communication device comprises an RF-IC (Integrated Circuit) that may be integrated in an RF-chip, where the RF-IC is connected via the multiplexer to the main antenna and to the second antenna. Then, a mobile communication device is obtained that has a main antenna and a second antenna and that may provide diversity or MIMO functionality but all main signals and diversity/MIMO signals can be conducted via the described multiplexer without the need for additionally dedicated filter circuits or front-end segments.

Hereinafter, central aspects of the multiplexer and of a mobile communication device and preferred but not limiting embodiments are provided in the schematic figures.

SHORT DESCRIPTION OF THE FIGURES

Figure 9:
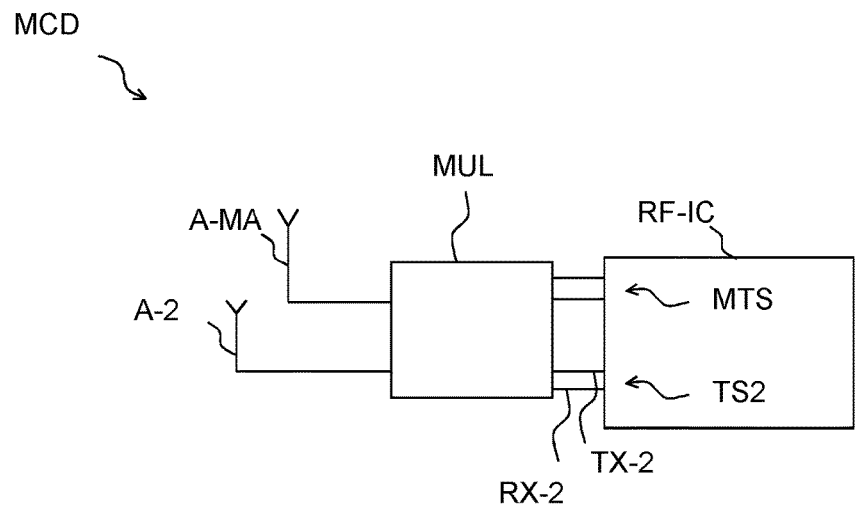
Figure 10:
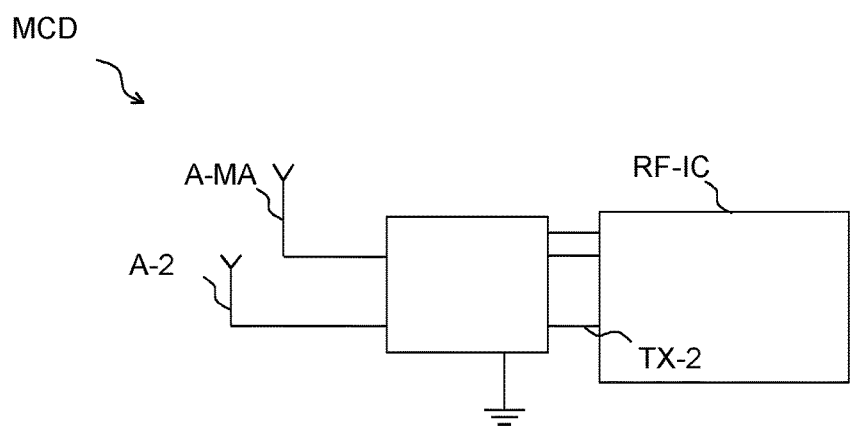
Figure 11:
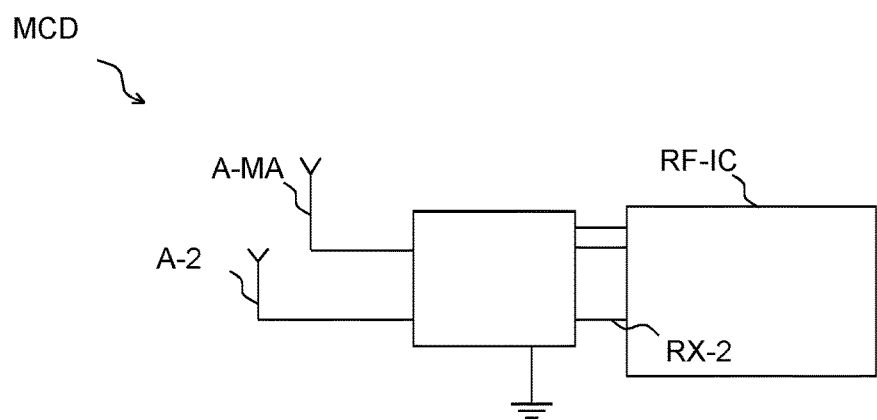

FIG. 9 shows an equivalent circuit diagram of a mobile communication device in which all six external ports of the multiplexer are utilized for data transmission, FIG. 10 shows an equivalent circuit diagram of a mobile communication device where the second signal path has only a TX port, FIG. 11 shows an equivalent circuit diagram of a mobile communication device in which the second signal path has only an RX port.

DETAILED DESCRIPTION

Figure 1:
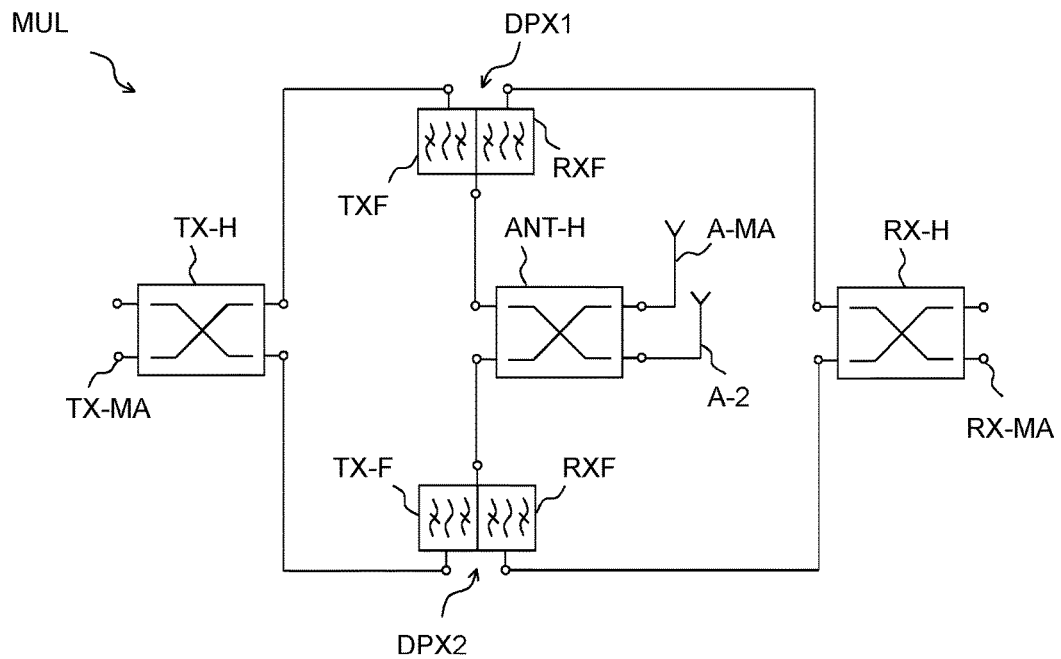
FIG. 1 shows an equivalent circuit diagram of the multiplexer.

FIG. 1 shows an equivalent circuit diagram of a multiplexer that allows propagation of signals of the main signal path while signals can propagate in a second signal path.

The multiplexer comprises three hybrids: a TX-side hybrid TX-H, a RX-side hybrid RX-H and an antenna-side hybrid ANT-H. Further, the multiplexer MUL comprises a first duplexer DPX1 and a second duplexer DPX2. Each duplexer has a transmission filter TXF and a reception filter RXF. Each of the transmission filters TXF of the duplexers DPX1, DPX2 is connected to one of internal ports of the TX-side hybrid TX-H. Each reception filter RXF of the duplexers DPX1, DPX2 is connected to a respective internal port of the RX-side hybrid RX-H. Each common port of the two duplexers is connected to respective internal ports of the antenna-side hybrid ANT-H. The TX-side hybrid TX-H has a main TX port TX-MA and the RX-side hybrid RX-H has a main RX port RX-MH. The antenna-side hybrid ANT-H has a main antenna port A-MA and a second antenna port A-2 that may be an antenna port for diversity functionality or for MIMO functionality.

Thus, with the main TX port, the main RX port and the main antenna port, the multiplexer MUL behaves as a conventional duplexer, however with superior electrical properties. Via the second antenna port A-2 and at least one of the additional external ports that are not terminated to ground, the multiplexer acts as an RF filter or as an additional duplexer with superior electrical properties. Thus, in total, the multiplexer provides real multiplexing functionality with excellent electrical qualities and practically no detrimental interaction resulting in excellent isolation properties.

Figure 2:
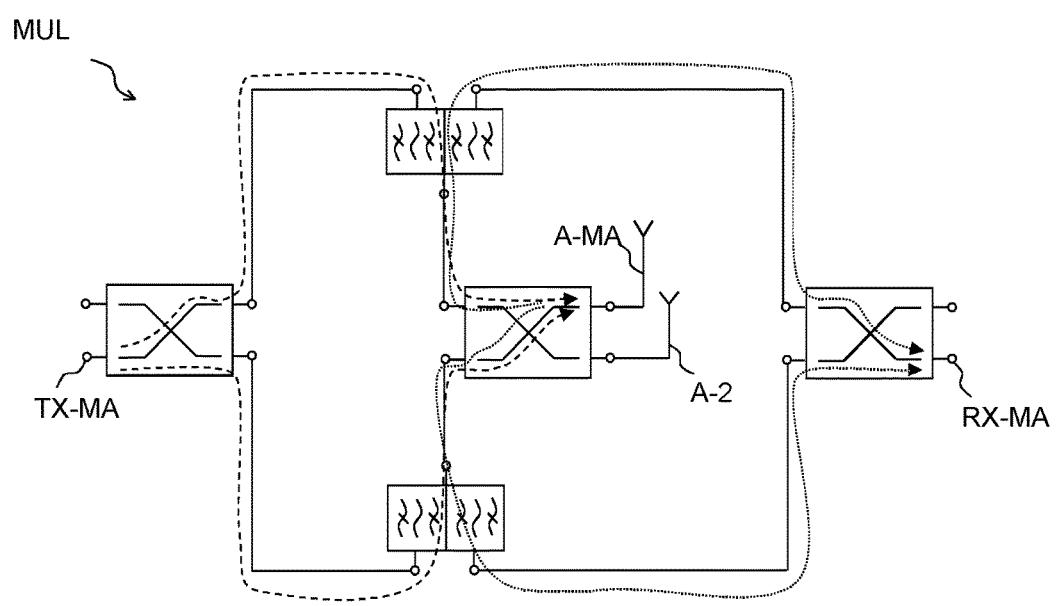
FIG. 2 shows data paths of TX and RX signals of the main signal path.

FIG. 2 illustrates the working principle of the multiplexer for main TX signals or main RX signals. At the main TX port TX-MA, TX signals are split into two sub-signals. Each sub-signal travels via one of the two duplexers. The antenna-side hybrid combines the two sub-sections at the main antenna port A-MA. Thus, each duplexer sees only 60% of the RF power transmitted at the antenna. Thus, the linear behavior of the multiplexer is also improved and the power durability is doubled.

Accordingly, reception signals received at the main antenna A-MA are divided into two sub-signals via the antenna-side hybrid. Each sub-signal travels via the respective reception filter of the respective duplexer to the RX-side hybrid where the two sub-signals are combined at the main RX port RX-MA.

Figure 3:
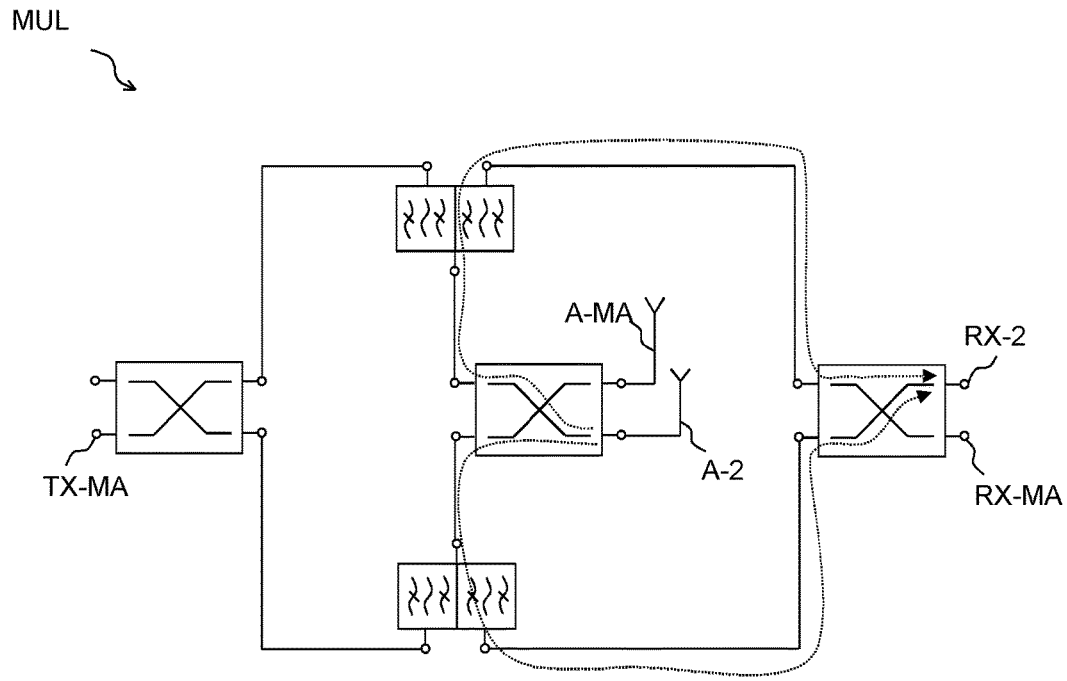
FIG. 3 shows signal paths of RF signals of the second signal path.

FIG. 3 shows how additionally received signals of a second transmit system are propagated to the second reception port RX-2. A second antenna A-2 is connected to the second antenna port of the antenna-side hybrid and the respective signal is split via this hybrid and propagates via the reception filters of the two duplexers to the RX-side hybrid where they are recombined at the second reception port RX-2.

Figure 4:
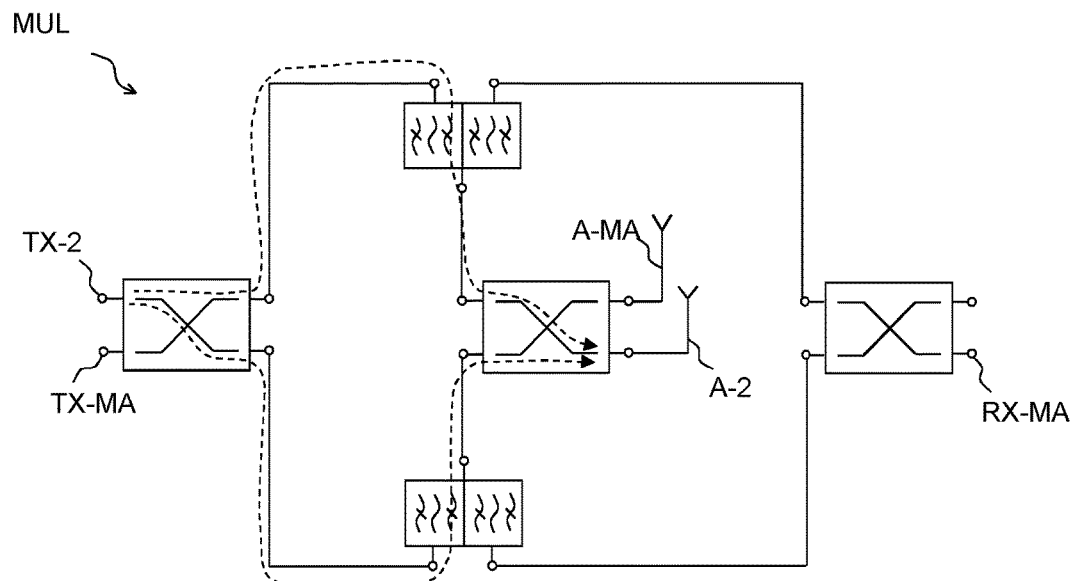
FIG. 4 shows signal paths of TX signals of the second signal path.

FIG. 4 illustrates how corresponding transmit signals are propagated from a second transmit port TX-2 of the TX-side hybrid to the second antenna port A-2. The TX-side hybrid receives the additional transmit signals at its second signal port TX-2 and splits the signal into two sub-signals. Each sub-signal travels via one of the respective TX filters of the respective duplexer. The sub-signals are recombined by the antenna-side hybrid and provided in phase at the second antenna port A-2.

Figure 5:
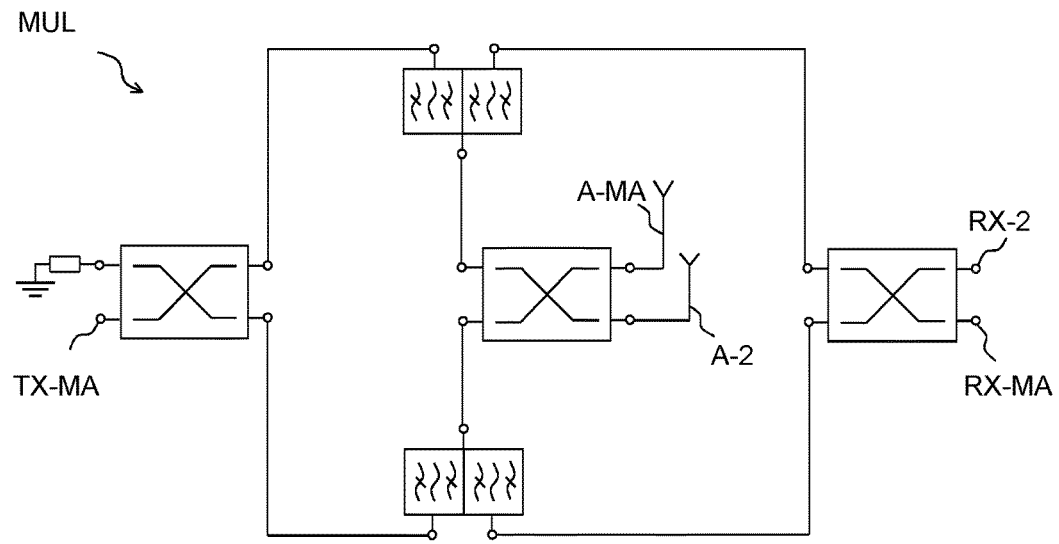
FIG. 5 shows a multiplexer for a second signal path with RX only signals.

FIG. 5 illustrates a multiplexer comprising a second RX port RX-2 at the antenna-side hybrid while the additional external port of the TX-side hybrid is terminated to ground. The multiplexer shown in FIG. 5 can only receive additional RF signals. However, the termination of the additional port at the TX-side hybrid provides an improved isolation as unwanted signals can be conducted to ground.

Figure 6:
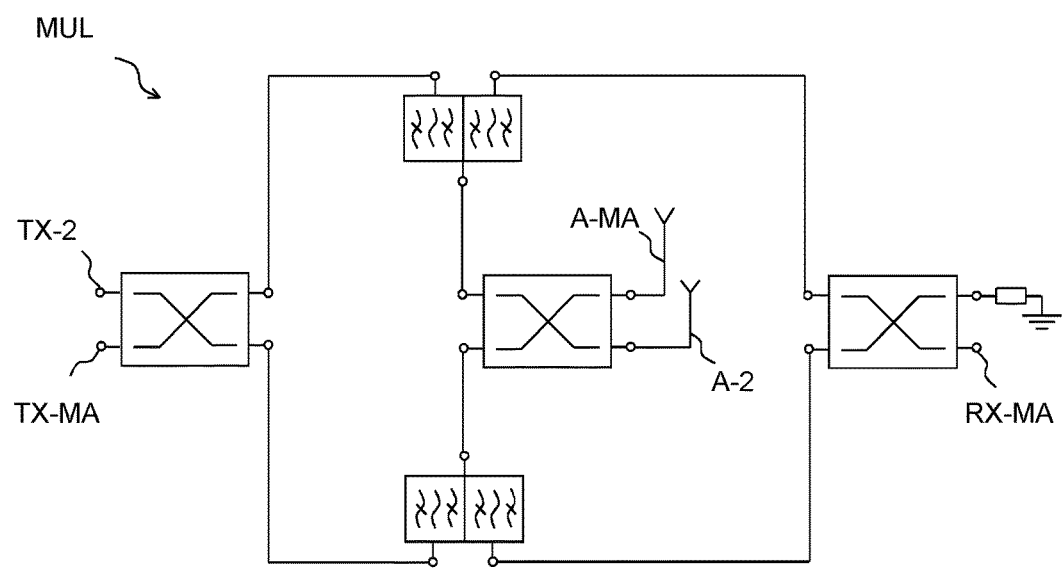
FIG. 6 shows a multiplexer with a second signal path for TX only signals.

Accordingly, FIG. 6 shows an embodiment of a multiplexer with a second TX port TX-2 while one of the ports of the RX-side hybrids is terminated to ground. Thus, the multiplexer shown in FIG. 6 can be utilized to transmit additional RF signals via the second antenna A-2 while the termination of the port of the RX-side hybrid provides improved isolation.

Figure 7:
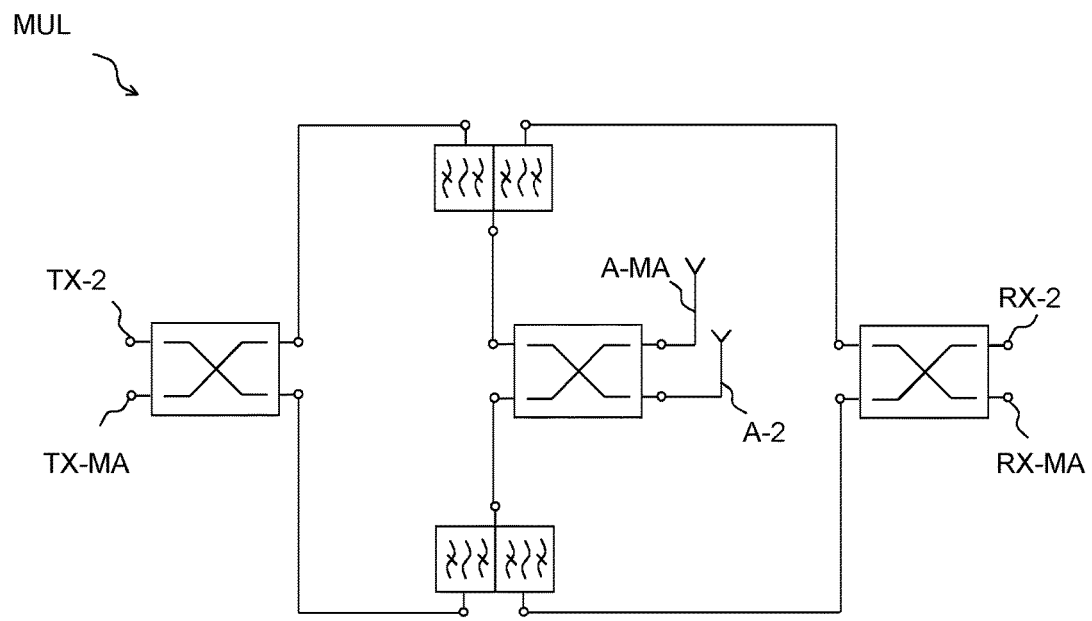
FIG. 7 shows a multiplexer for a second signal path with TX and RX signals.

FIG. 7 shows an equivalent circuit diagram of a multiplexer with a second TX port TX-2 and a second RX port RX-2. In combination with the second antenna A-2 connected to the second antenna port of the antenna-side hybrid, the multiplexer can be used for both TX and RX transmission into different transmission standards fully separated from each other.

Figure 8:
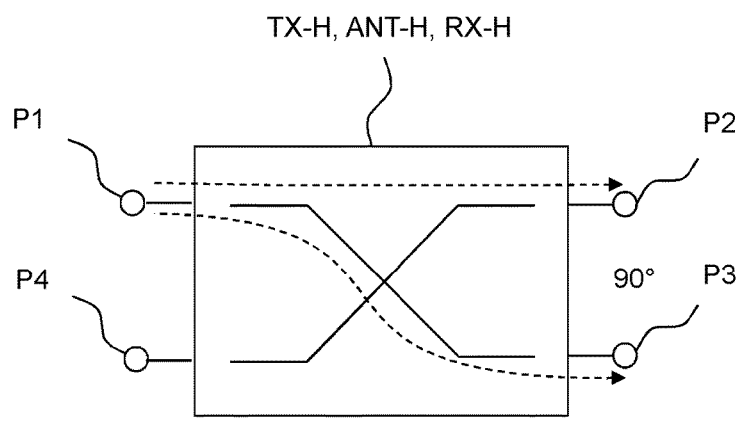
FIG. 8 shows the working principle of a hybrid.

FIG. 8 illustrates the working principle of a hybrid. The hybrid has a first port P1, a second port P2, a third port P3 and a fourth port P4. Each of the four ports can act as an input port. Without loss of generality, FIG. 8 shows the first port P1 as the input port. An input signal is split into two sub-signals. One sub-signal is provided at the second port P2 while the second sub-signal is provided at the third port P3. The fourth port P4 is not directly coupled to the first port P1. The phase difference between the RF signals/sub-signals at ports P2 and P3 is approximately 90°.

Accordingly, if a first sub-signal is entered into port P2 and a second sub-signal is entered into port P3 and the phase differences between the sub-signals is approximately 90° and the amplitudes of the sub-signals are mainly equal, then the two sub-signals are combined and provided at the first port P1.

Such hybrids can be manufactured using LC elements and/or $\lambda/4$ transmission lines and/or $\lambda/2$ transmission lines. Of course, hybrids with discrete inductors and capacitors are also possible.

FIG. 9 shows the equivalent circuit diagram of a mobile communication device MCD comprising one of the above described multiplexers MUL and an RF-integrated circuit RF-IC which may be implemented in an RF-chip. The multiplexer MUL has four external contacts. Via two of the external contacts, the multiplexer MUL is connected to the two antennas: each of the two antenna ports is connected to one antenna. The antenna comprises the main antenna A-MA and the second antenna A-2. Via two ports, the multiplexer MUL is connected to the RF-IC establishing the main transmission system MTS while via the second TX port and the second RX port, the multiplexer MUL is connected to the RF-IC establishing a second transmission system TS2.

FIG. 10 illustrates that one of the external ports of the multiplexer can be terminated to ground. The remaining connection port can be a transmission port/can be the second transmission port TX-2 via which the multiplexer is connected to the RF-IC.

FIG. 11 illustrates the possibility of the only remaining port of the second transmission system TS2 being the second reception port RX-2 while the remaining port of the multiplexer is terminated to ground.

LIST OF REFERENCE SIGNS

A-2: second antenna
A-MA: main antenna
ANT-H: antenna-side hybrid
DPX1: first duplexer
DPX2: second duplexer
MCD: mobile communication device
MTS: main transmission system
MUL: multiplexer
P1, P2, P3, P4: ports of a hybrid
RF-IC: RF-integrated circuit
RX-2: second RX port RXF: reception filter
RX-H: RX-side hybrid
RX-MA: main reception port
TS2: second transmission system
TX-2: second TX port
TXF: transmission filter
TX-H: TX-side hybrid
TX-MA: main TX port

The invention claimed is:

1. A multiplexer, supporting signal transmission in a main signal path and a second signal path, comprising:
   a transmit (TX)-side hybrid with a main TX port and a second TX port;
   a receive (RX)-side hybrid with a main RX port and a second RX port;
   an antenna-side hybrid with a main antenna port and a second antenna port;
   a first duplexer;
   a second duplexer;
   wherein not more than one of the main TX port, the second TX port, the main RX port, the second RX port, the main antenna port, and the second antenna port is terminated to ground,
   wherein the first duplexer connects the TX-side hybrid to the antenna-side hybrid and connects the RX-side hybrid to the antenna-side hybrid, and
   wherein the second duplexer connects the TX-side hybrid to the antenna-side hybrid and connects the RX-side hybrid to the antenna-side hybrid.

2. The multiplexer of claim 1, wherein the main TX port is provided for TX signals of the main signal path and the main RX port is provided for RX signals of the main signal path.

3. The multiplexer of claim 1, wherein one of the second TX port and the second RX port is terminated to ground via a 50Ω impedance element.

4. The multiplexer as in claim 1, 2, or 3, wherein the second TX port and the second RX port are ports of a multiple input multiple output (MIMO) transmission system.

5. The multiplexer as in claim 1, 2, or 3, wherein the main antenna port is connected to a main antenna and the second antenna port is connected to a diversity or to a multiple input multiple output (MIMO) antenna.

6. The multiplexer as in claim 1, 2, or 3, further comprising a power amplifier and a low noise amplifier in the main signal path.

7. The multiplexer as in claim 1, 2, or 3, further comprising a power amplifier and/or a low noise amplifier in the second signal path.

8. The multiplexer as in claim 1, 2, or 3, wherein both duplexers are used in the main signal path for TX and RX signals of a main transmission system and in the second signal path for TX and/or RX signals in a second transmission system.

9. A mobile communication device comprising a multiplexer as in claim 1.

10. The mobile communication device of claim 9, further comprising a main antenna and a second antenna.

11. The mobile communication device of claim 10, further comprising radio frequency integrated-circuit (RF-IC) coupled, via the multiplexer, to the main antenna and to the second antenna.

* * * * *